US008107298B2

(12) United States Patent
Mui et al.

(10) Patent No.: US 8,107,298 B2
(45) Date of Patent: Jan. 31, 2012

(54) NON-VOLATILE MEMORY WITH FAST BINARY PROGRAMMING AND REDUCED POWER CONSUMPTION

(75) Inventors: Man L. Mui, Santa Clara, CA (US);
Pao-Ling Koh, Sunnyvale, CA (US);
Tien-Chien Kuo, Sunnyvale, CA (US);
Khanh T. Nguyen, Sunnyvale, CA (US)

(73) Assignee: SanDisk Technologies Inc., Plano, TX (US)

( * ) Notice: Subject to any disclaimer, the term of this patent is extended or adjusted under 35 U.S.C. 154(b) by 219 days.

(21) Appl. No.: 12/697,017

(22) Filed: Jan. 29, 2010

(65) Prior Publication Data

US 2011/0188317 A1    Aug. 4, 2011

(51) Int. Cl.
*G11C 11/34* (2006.01)

(52) U.S. Cl. ............... 365/185.22; 365/189.05; 365/203

(58) Field of Classification Search ............. 365/185.22, 365/195, 189.05, 203
See application file for complete search history.

(56) References Cited

U.S. PATENT DOCUMENTS

| | | | |
|---|---|---|---|
| 3,553,491 A | 1/1971 | Schulz | |
| 4,742,488 A | 5/1988 | Wong | |
| 5,608,681 A | 3/1997 | Priebe et al. | |
| 5,771,196 A | 6/1998 | Yang | |
| 5,835,421 A | 11/1998 | Pham et al. | |
| 5,963,060 A | 10/1999 | Varadarajan et al. | |
| 7,251,160 B2 | 7/2007 | Li et al. | |
| 7,313,022 B2 | 12/2007 | Takeuchi et al. | |
| 7,391,649 B2 | 6/2008 | Kang et al. | |
| 7,400,547 B2 | 7/2008 | Oikawa | |
| 7,447,081 B2* | 11/2008 | Chan | 365/185.22 |
| 7,492,640 B2 | 2/2009 | Mokhlesi | |
| 7,577,037 B2* | 8/2009 | Li et al. | 365/185.22 |
| 7,630,248 B2* | 12/2009 | Li | 365/185.18 |
| 2004/0109357 A1 | 6/2004 | Cernea et al. | |
| 2006/0140007 A1 | 6/2006 | Cernea et al. | |
| 2007/0253254 A1 | 11/2007 | Morooka et al. | |
| 2007/0297228 A1 | 12/2007 | Song et al. | |
| 2008/0225618 A1 | 9/2008 | Hosono et al. | |
| 2010/0008157 A1 | 1/2010 | Honma | |

FOREIGN PATENT DOCUMENTS

EP    1315171 A2    5/2003

OTHER PUBLICATIONS

International Search Report & The Written Opinion of the International Searching Authority dated Apr. 8, 2011, International Application No. PCT/US2011/022733 filed Jan. 27, 2011.

* cited by examiner

*Primary Examiner* — Son Dinh
(74) *Attorney, Agent, or Firm* — Vierra Magen Marcus & DeNiro LLP

(57) ABSTRACT

In a non-volatile storage system, the time needed to perform a programming operation is reduced by minimizing data transfers between sense modules and a managing circuit. A sense module is associated with each storage element. Based on write data, a data node in the sense module is initialized to "0" for a storage element which is to remain in an erased state, and to "1" for a storage element which is to be programmed to a programmed state, then flipped to "0" when programmed is completed. The managing circuit is relieved of the need to access the write data to determine whether a "0" represents a storage element for which programming is completed. Power consumption can also be reduced by keeping a bit line voltage high between a verify phase of one program-verify iteration and a program phase of a next program-verify iteration.

20 Claims, 10 Drawing Sheets

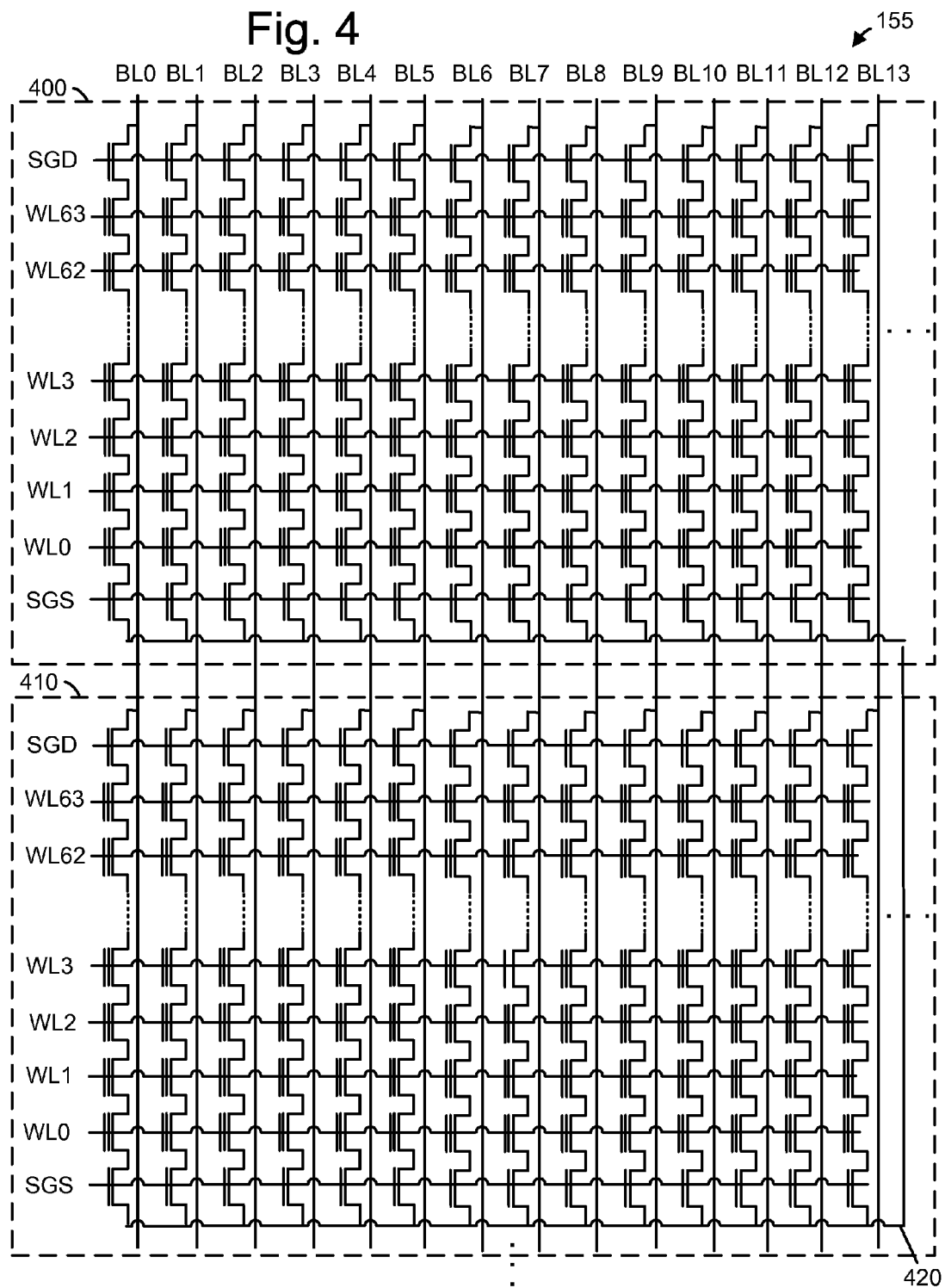

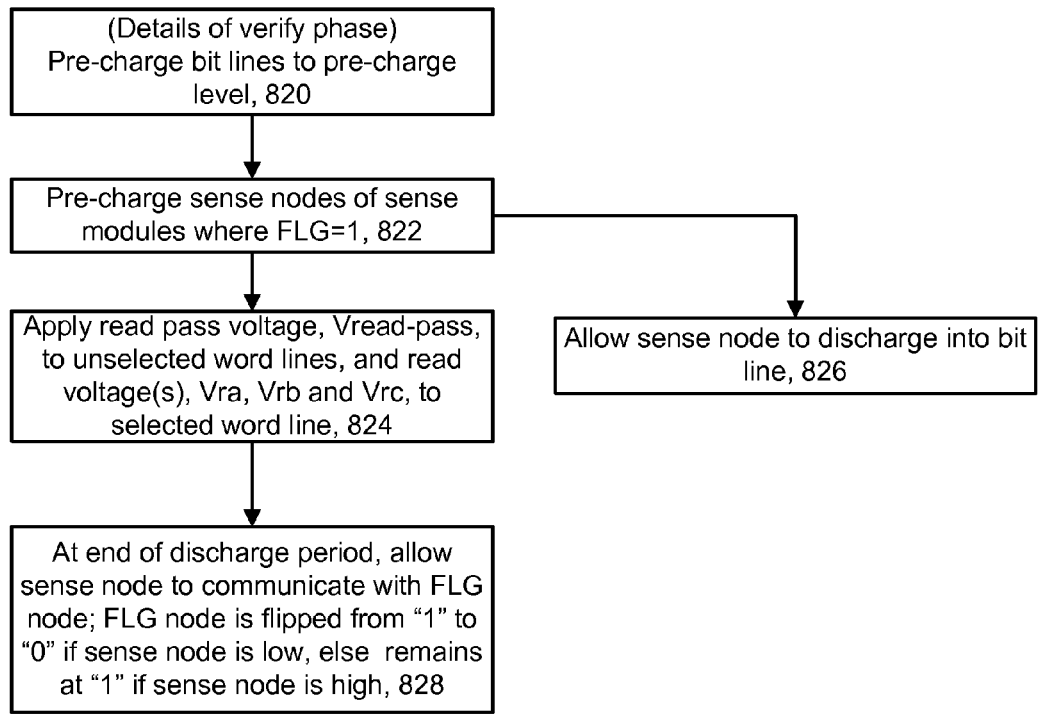
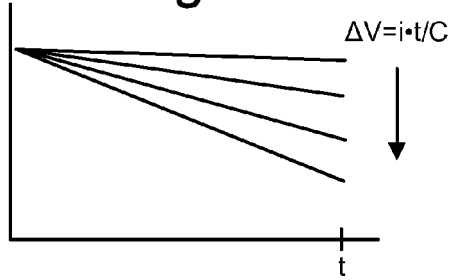

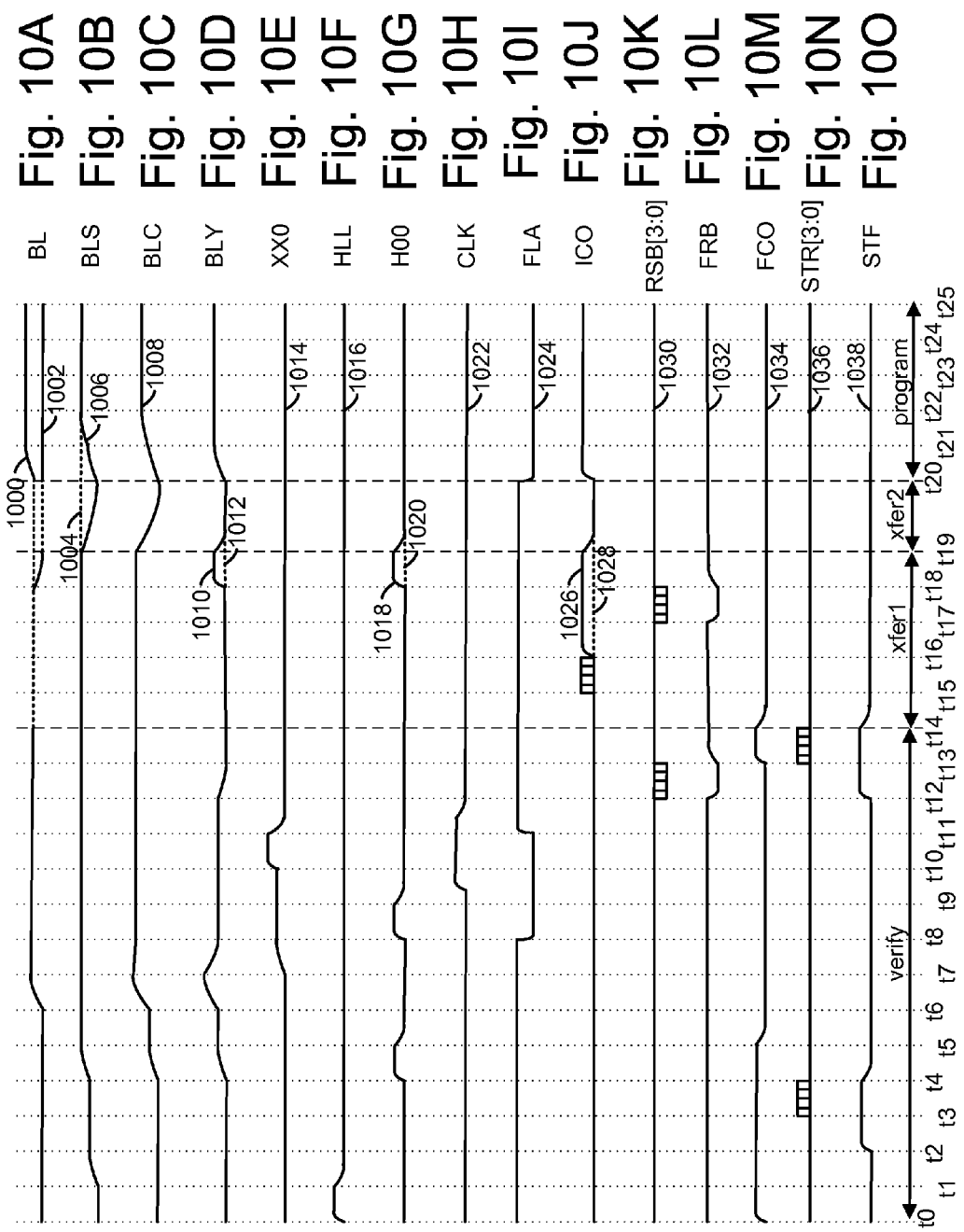

US 8,107,298 B2

NON-VOLATILE MEMORY WITH FAST BINARY PROGRAMMING AND REDUCED POWER CONSUMPTION

BACKGROUND

The present technology relates to non-volatile memory.

Semiconductor memory has become increasingly popular for use in various electronic devices. For example, non-volatile semiconductor memory is used in cellular telephones, digital cameras, personal digital assistants, mobile computing devices, non-mobile computing devices and other devices. Electrically Erasable Programmable Read Only Memory (EEPROM) and flash memory are among the most popular non-volatile semiconductor memories. With flash memory, also a type of EEPROM, the contents of the whole memory array, or of a portion of the memory, can be erased in one step, in contrast to the traditional, full-featured EEPROM.

Both the traditional EEPROM and the flash memory utilize a floating gate that is positioned above and insulated from a channel region in a semiconductor substrate. The floating gate is positioned between the source and drain regions. A control gate is provided over and insulated from the floating gate. The threshold voltage (Vth) of the transistor thus formed is controlled by the amount of charge that is retained on the floating gate. That is, the minimum amount of voltage that must be applied to the control gate before the transistor is turned on to permit conduction between its source and drain is controlled by the level of charge on the floating gate.

Due to marketplace pressures, there is a continuing need for faster programming and reduced power consumption.

BRIEF DESCRIPTION OF THE DRAWINGS

FIG. 4 depicts blocks of NAND flash memory cells in the memory array 155 of FIG. 1.

FIG. 8b depicts an example implementation of the program phase of step 800 of FIG. 8a.

FIG. 8c depicts an example implementation of the verify phase of step 802 of FIG. 8a.

FIG. 8d depicts an example of the sense node discharge process of step 826 of FIG. 8c.

FIG. 8e depicts an example implementation of the data transfer phase of step 804 of FIG. 8a.

FIGS. 10A-10O depict time lines associated with the reduced power consumption technique of FIGS. 8a-8e and the reduced programming time technique of FIG. 9a.

DETAILED DESCRIPTION

Faster binary programming and reduced power consumption are provided in a non-volatile storage system.

In a non-volatile storage system, a programming operation typically includes a number of program-verify iterations which are performed until all, or a sufficient portion of, a set of storage elements have completed programming. Typically, each program-verify iteration includes a programming phase in which a program pulse is applied to a set of storage elements, and a verify phase in which a sensing operation is performed for selected storage elements via associated bit lines. As part of the sensing operation and a subsequent data transfer between the sense modules and a managing circuit, the bit lines are charged and then discharged. In the programming phase of a subsequent program-verify operation, some of the storage elements which have completed programming will have their bit lines raised to an inhibit level to inhibit programming. Reduced power consumption can be realized by avoiding a cycle of lowering and raising the bit line voltage for the inhibited storage elements. Instead, the bit line voltage can be floated during the data transfer and subsequently driven to the inhibit level in the program phase of the subsequent program-verify operation.

In another aspect, programming time can be reduced in a non-volatile storage system in which the storage elements store data in one of two data states, an erased state and a programmed state. Based on write data, a data node in each sense module is initialized to "0" for a storage element which is to remain in an erased state, and to "1" for a storage element which is to be programmed to the programmed state, then flipped to "0" when programming is completed. The managing circuit performs a scan of the sense modules in each program-verify operation to determine if programming has been completed. By initializing the sense modules based on the target data state, the managing circuit is relieved of the need to access the write data to determine whether a "0" represents a storage element for which programming is completed, or a storage element which is in the erased state.

Figure 1:
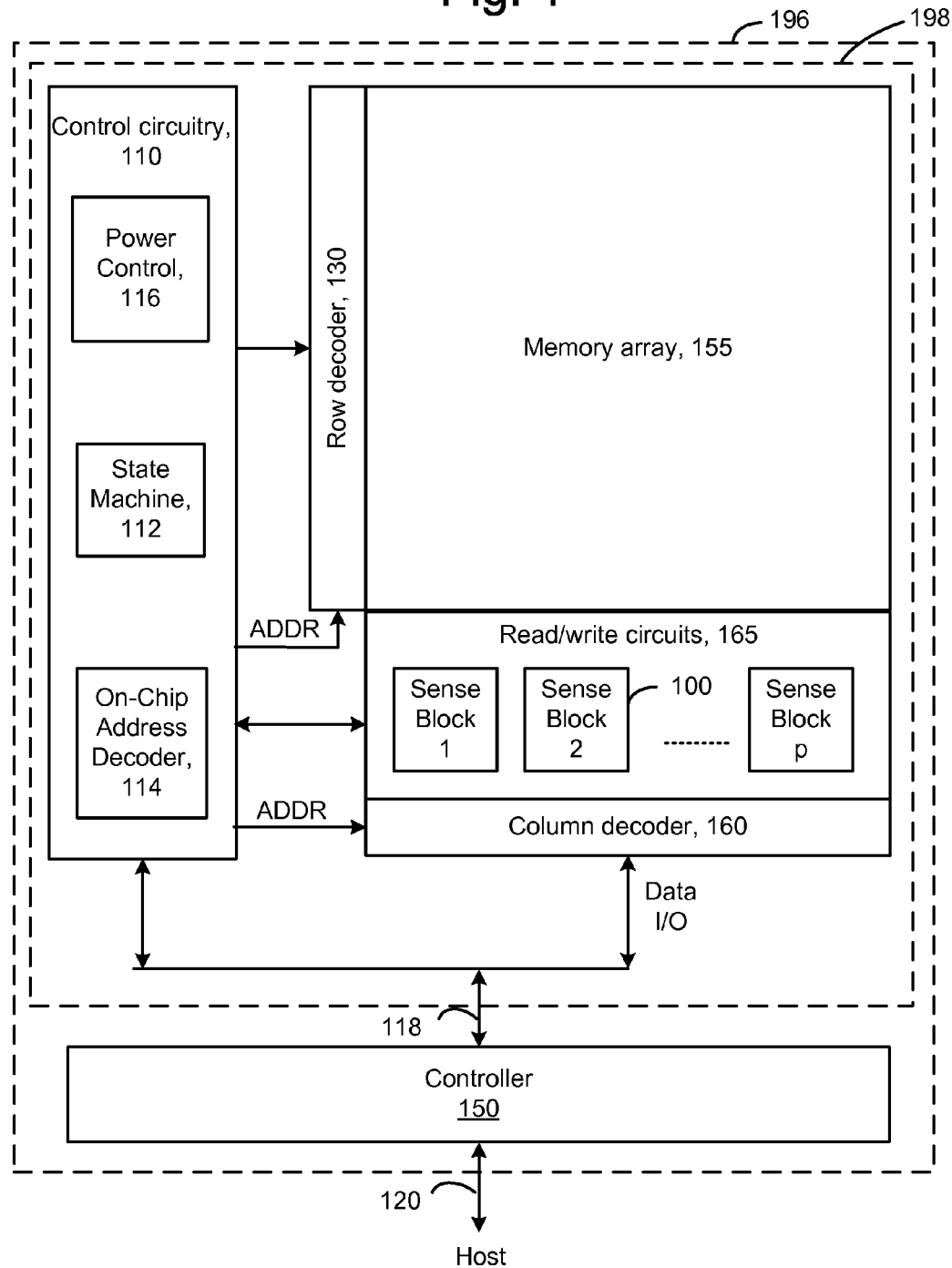
FIG. 1 is a block diagram of a non-volatile memory system using single row/column decoders and read/write circuits.

An example memory system which can be used to provide faster programming and reduced power consumption is discussed next. FIG. 1 is a block diagram of a non-volatile memory system using single row/column decoders and read/write circuits. The diagram illustrates a memory device 196 having read/write circuits for reading and programming a page of storage elements in parallel, according to one embodiment. Memory device 196 may include one or more memory die 198. Memory die 198 includes a two-dimensional memory array of storage elements 155, control circuitry 110, and read/write circuits 165. The memory array 155 is discussed further in connection with FIG. 4.

In some embodiments, the array of storage elements can be three dimensional. The memory array 155 is addressable by word lines via a row decoder 130 and by bit lines via a column decoder 160. The read/write circuits 165 include multiple sense blocks 100 and allow a page of storage elements to be read or programmed in parallel. Typically a controller 150 is included in the same memory device 196 (e.g., a removable storage card) as the one or more memory die 198. Commands and data are transferred between the host and controller 150 via lines 120 and between the controller and the one or more memory die 198 via lines 118.

The control circuitry 110 cooperates with the read/write circuits 165 to perform memory operations on the memory array 155, and includes a state machine 112, an on-chip address decoder 114, and a power control module 116. The state machine 112 provides chip-level control of memory operations. The on-chip address decoder 114 provides an address interface between that used by the host or a memory controller to the hardware address used by the decoders 130 and 160. The power control module 116 controls the power and voltages supplied to the word lines and bit lines during memory operations.

In some implementations, some of the components of FIG. 1 can be combined. In various designs, one or more of the components (alone or in combination), other than memory array 155, can be thought of as a control circuit. For example, one or more control circuits may include any one of, or a combination of, control circuitry 110, state machine 112, decoders 114/160, power control 116, sense blocks 100 (including the processor 192 in FIG. 2), read/write circuits 165, and controller 150, etc. The sense block 100 is discussed further in connection with FIG. 2.

In another embodiment, a non-volatile memory system uses dual row/column decoders and read/write circuits. Access to the memory array 155 by the various peripheral circuits is implemented in a symmetric fashion, on opposite sides of the array, so that the densities of access lines and circuitry on each side are reduced by half. Thus, the row decoder is split into two row decoders and the column decoder into two column decoders. Similarly, the read/write circuits are split into read/write circuits connecting to bit lines from the bottom and read/write circuits connecting to bit lines from the top of the array 155. In this way, the density of the read/write modules is essentially reduced by one half.

Figure 2:
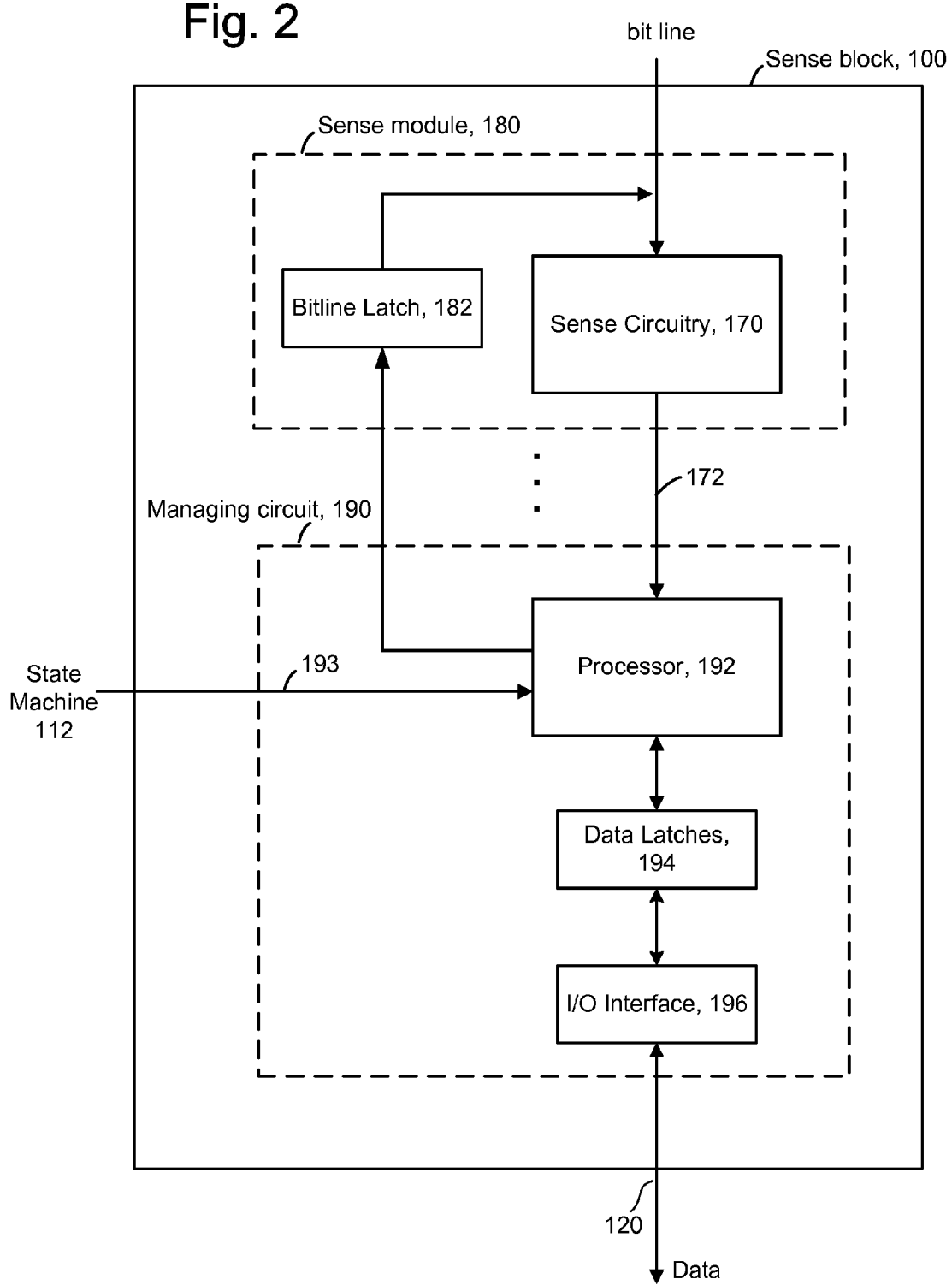
FIG. 2 is a block diagram depicting one embodiment of the sense block 100 of FIG. 1.

FIG. 2 is a block diagram depicting one embodiment of a sense block. An individual sense block 100 is partitioned into one or more core portions, referred to as sense modules 180 or sense amplifiers, and a common portion, referred to as a managing circuit 190. In one embodiment, there will be a separate sense module 180 for each bit line and one common managing circuit 190 for a set of multiple, e.g., four or eight, sense modules 180. Each of the sense modules in a group communicates with the associated managing circuit via data bus 172. Thus, there are one or more managing circuits which communicate with the sense modules of a set of storage elements.

Sense module 180 comprises sense circuitry 170 that determines whether a conduction current in a connected bit line is above or below a predetermined threshold level. Sense module 180 also includes a bit line latch 182 that is used to set a voltage condition on the connected bit line. For example, a predetermined state latched in bit line latch 182 will result in the connected bit line being pulled to a state designating program inhibit (e.g., 1.5-3 V). As an example, a value of FLG=0 (see FIG. 3) can inhibit programming, while FLG=1 does not inhibit programming.

Managing circuit 190 comprises a processor 192, a set of data latches 194 and an I/O Interface 196 coupled between the set of data latches 194 and data bus 120. Processor 192 performs computations, such as to determine the data stored in the sensed storage element and store the determined data in the set of data latches. The set of data latches 194 is used to store data bits determined by processor 192 during a read operation, and to store data bits imported from the data bus 120 during a program operation. The imported data bits represent write data intended to be programmed into the memory. I/O interface 196 provides an interface between data latches 194 and the data bus 120.

During reading, the operation of the system is under the control of state machine 112 that controls the supply of different control gate voltages to the addressed storage element. As it steps through the one or more various predefined control gate voltages corresponding to the various memory states supported by the memory, the sense module 180 may trip at one of these voltages and an output will be provided from sense module 180 to processor 192 via bus 172. At that point, processor 192 determines the resultant memory state by consideration of the tripping event(s) of the sense module and the information about the applied control gate voltage from the state machine via input lines 193. It then computes a binary encoding for the memory state and stores the resultant data bits into data latches 194. In another embodiment, bit line latch 182 serves double duty, both as a latch for latching the output of the sense module 180 and also as a bit line latch as described above.

Some implementations can include multiple processors 192. In one embodiment, each processor 192 will include an output line (not depicted) such that each of the output lines is wired-OR'd together. In some embodiments, the output lines are inverted prior to being connected to the wired-OR line. This configuration enables a quick determination during the program verification process of when the programming process has completed because the state machine receiving the wired-OR can determine when all bits being programmed have reached the desired level. For example, when each bit has reached its desired level, a logic zero for that bit will be sent to the wired-OR line (or a data one is inverted). When all bits output a data 0 (or a data one inverted), then the state machine knows to terminate the programming process. Because each processor communicates with eight sense modules, the state machine needs to read the wired-OR line eight times, or logic is added to processor 192 to accumulate the results of the associated bit lines such that the state machine need only read the wired-OR line one time. Similarly, by choosing the logic levels correctly, the global state machine can detect when the first bit changes its state and change the algorithms accordingly.

During program or verify operations, the data to be programmed (write data) is stored in the set of data latches 194 from the data bus 120. The program operation, under the control of the state machine, comprises a series of programming voltage pulses applied to the control gates of the addressed storage elements. Each program pulse is followed by a read back (verify) to determine if the storage element has been programmed to the desired memory state. In some cases, processor 192 monitors the read back memory state relative to the desired memory state. When the two are in agreement, the processor 192 sets the bit line latch 182 so as to cause the bit line to be pulled to a state designating program inhibit. This inhibits the storage element coupled to the bit line from further programming even if program pulses appear on its control gate. In other embodiments the processor initially loads the bit line latch 182 and the sense circuitry sets it to an inhibit value during the verify process. In a reduced programming time technique discussed herein, the processor 192 need not monitor the read back memory state relative to the desired memory state, or access or refer to the write data in the data latches.

Data latch stack 194 contains a stack of data latches for each sense module. In one embodiment, there are three data latches per sense module 180. In some implementations, the data latches are implemented as a shift register so that the parallel data stored therein is converted to serial data for data bus 120, and vice versa. All the data latches corresponding to the read/write block of m storage elements can be linked together to form a block shift register so that a block of data can be input or output by serial transfer. In particular, the bank of read/write modules is adapted so that each of its set of data latches will shift data in to or out of the data bus in sequence as if they are part of a shift register for the entire read/write block.

Figure 3:
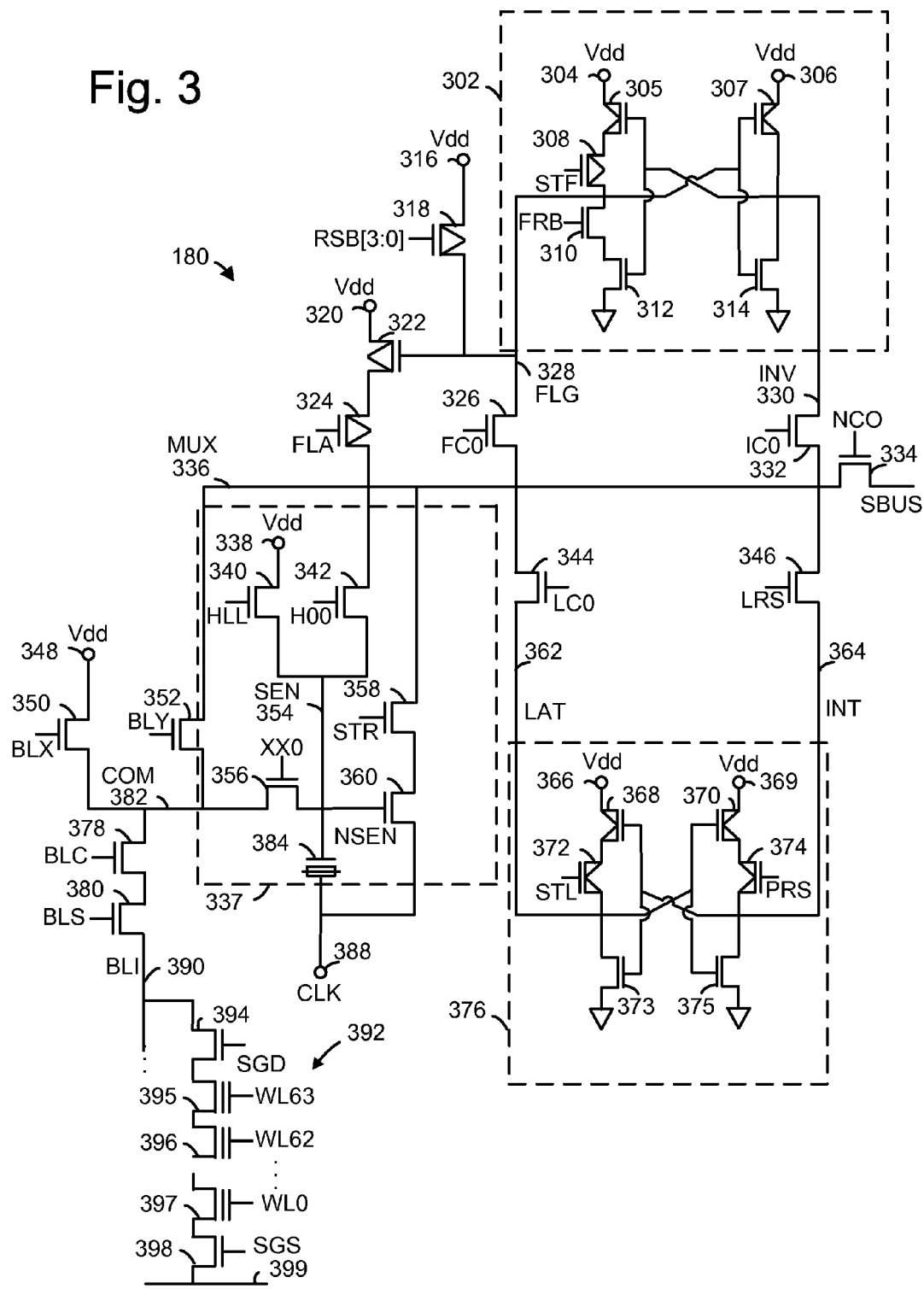
FIG. 3 depicts one example implementation of the sense module 180 of FIG. 2.

FIG. 3 depicts one example implementation of the sense module 180 of FIG. 2. A large number of sense modules, e.g., 64K sense modules in a plane, typically receive common control signals, and access one or more common power supplies. Each sense module includes transistors which receive control signals such as BLX, BLC, CLK, ICO, LCO and FCO and so forth. These control signals can be provided by the processors 192 in the managing circuits responsive to the state machine 112. For some control signals, individual sense modules can be addressed in a time-multiplexed manner. For example, RSB[3:0] indicates that this control signals can be provided independently to four separate sense modules, e.g., which are associated with a common managing circuit. Furthermore, data values which are specific to a sense module can be maintained within a sense module. These include FLG, INV, LAT, INT, MUX, SEN and COM.

Generally, each sense module includes a sense node 354 which communicates with a respective bit line 390, and each bit line is associated with a respective chain of series-connected storage elements, such as NAND string 392, in a memory array. Further, an FLG path or node 328 provides a data node which is configured by a managing circuit. In a reduced programming time technique, the FLG node 328 need only be configured by the managing circuit at the start of a programming operation, and not in each program-verify iteration. In another approach, the FLG node 328 is configured by the managing circuit in each program-verify iteration.

In a bit scan operation, the managing circuit prompts the sense modules to provide data to the managing circuit which represents the value of the FLG node. For example, the FLG value itself can be provided. In another possible approach, the value at the INV node 330, which is the inverse of FLG, can be communicated from the sense module to the managing circuit via the ICO and NCO transistors. The managing circuit thus can read the value of the FLG node. In some cases, the managing circuit compares FLG (or another value such as INV from which FLG can be derived) to write data which is stored in its data latches to determine whether programming has been completed for the storage element associated with the sense module. This comparison can involve logical operations which are performed by the processor 192 using data in the data latches 194 and a result from the sensing operation at the sense module.

The transistors depicted can include n-type metal-oxide-semiconductor field-effect transistor (MOSFETs) and partially-insulated field-effect transistors (PiFETs), for instance. The sense module 180 includes, generally, a sense portion 337, a FLG latch 302 and a LAT latch 376. The FLG latch 302 sets the FLG node 328 to high or low. Nodes 304 and 306 receive a power supply Vdd. Vdd can be about 1.5-2.5 V, for instance. STF transistor 308 and FRB transistor 310 receive appropriate control signals to provide the desired FLG level. In this implementation, the STF transistor 308 is a PiFET, and the symbol used to identify it is as a PiFET is used elsewhere in FIG. 3 to identify other PiFETs. Also, the FRB transistor 310 is an nMOS, and the symbol used to identify it is as an nMOS is used elsewhere in FIG. 3 to identify other nMOSs.

A gate of a transistor 305 is connected to a transistor 312 of a ground path. Similarly, a gate of a transistor 307 is connected to a transistor 314 of a ground path.

With FLG high (FLG=1), a transistor 322 is non-conductive. With FLG=0, transistor 322 is conductive and couples a power supply terminal 320 to a FLA transistor 324.

An NCO transistor 334 connects a MUX path 336 to a sense bus (SBUS) for input and output of data. An ICO transistor 332 controls whether the INV path 330 communicates with the MUX path 336. An FCO transistor 326 controls whether the FLG path 328 communicates with the MUX path 336 and the SEN node 354, when NSEN and STR are conductive.

A reset or RSB transistor 318 controls whether a power supply node 316 communicates with the FLG path 328.

In the LAT latch 376, a value LAT is set on path 362 to high or low. INT on path 364 is the inverse of LAT. Nodes 366 and 369 receive Vdd. STL transistor 372 and PRS transistor 374 receive appropriate control signals to provide the desired LAT level. A gate of transistor 368 is connected to a transistor 373 of a ground path. Similarly, a gate of transistor 370 is connected to a transistor 375 of a ground path.

An LCO transistor 344 controls whether the LAT path 362 communicates with the MUX path 336. An LRS transistor 346 controls whether the INT path 364 communicates with the MUX path 336.

The sense portion 337, which is used during a verify or read operation, includes a sense path or node 354, a XX0 transistor 356 which controls whether the sense path communicates with the COM path 382, an HLL transistor 340 which controls whether the sense path communicates with a power supply node 338, and an H00 transistor 342 which controls whether the sense path communicates with the MUX path 336. The H00 and HLL transistors can be used for lock out or no lock out sensing, respectively. The SEN path 354 is coupled to a control gate of an NSEN transistor 360, and an STR transistor 358 controls whether the transistor 360 communicates with the MUX path 336. A clock CLK signal is provided at a node 388 to a dynamic capacitor 384.

A BLY transistor 352 controls whether the MUX path 336 communicates with the COM path 382, while a BLX transistor 350 controls whether the COM path 382 communicates with a power supply node 348. The BLC transistor 378 and BLS transistor 380 control whether the COM path 382 communicates with the bit line BLI 390. BLC is a low voltage transistor which is opened to allow SEN to discharge into the bit line during sensing. BLS is a high voltage transistor. The bit line 390 may communicate with one or more NAND strings. An example NAND string 392 includes a drain select gate SGD 394, storage elements 395, 396, . . . , 397 whose control gates communicate with word lines WL63, WL62, . . . , WL0, respectively, for example, and a source select gate SGS 398 which communicates with a source line 399.

Generally, a read operation involves applying a control gate voltage such as Vra, Vrb or Vrc to a selected storage element in the NAND string 392. A verify operation involves applying a control gate voltage such as Vva, Vvb or Vvc to a selected storage element. The control gate voltage can be applied via a corresponding word line to multiple selected storage elements in corresponding multiple NAND strings at the same time. Each NAND string may have a respective sense module, in one possible approach. The control gate voltages of other, unselected storage elements in the NAND string 392 and other NAND strings are raised to a level (referred to as a read pass level) which is sufficient to render the unselected storage elements conductive. With the control gate voltage applied, the sense module 180 is controlled to communicate with the selected storage element, via a respective bit line, to determine the state of the storage element. Typically, a conductive or non-conductive state of the selected storage can be determined.

In one possible implementation, the HLL transistor 340 receives a voltage Vhll at its control gate which sets an initial voltage level of the sense node 354 as Vhll-Vth, where Vth is a threshold voltage of the HLL transistor 340. Essentially, the HLL transistor allows a portion of the supply voltage Vdd at node 338 to reach the sense node. The HLL transistor 340 may therefore be considered to be a voltage-setting transistor. The voltage applied to the sense node is considered to provide a pre-charge of the sense node. At this time, the sense node is not allowed to communicate with the bit line 390 by providing the XX0 transistor 356 in a non-conductive state. Subsequently, Vhll is lowered so that the HLL transistor 340 becomes non-conductive, and the sense node is cutoff from the supply node 338. The BLX transistor 350 is made conductive to provide Vdd at node 348 to the BLC transistor 378, and a gate of the BLC transistor is controlled to pass a portion of Vdd to the bit line 390, thereby pre-charging the bit line. BLC is a bit line clamp transistor because it clamps the bit line voltage according to BLC's control gate voltage.

The XX0 transistor 356 is controlled to be in a conductive state, so that the sense node 354 communicates with the bit line 390. The SGS transistor 398 is also controlled to be in a conductive state so that the sense node can discharge into the bit line, the unselected storage elements, and the selected storage element, to the source line 399, if the selected storage element is in a conductive state. If the selected storage element is in a non-conductive state, the sense node will not appreciably discharge.

When the XX0 transistor 356 is conductive, a path from node 348 to the bit line 390, via the BLX transistor 350, is also conductive. Node 348 is at a higher voltage than the sense node, so the current from the sense node will go towards the bit line until the sense node drops below a certain level. Once the sense node is below the BLX voltage, there will not be any more current flowing through the XX0 transistor 356 to the bit line 390. Instead, all current coming to the bit line will be from the BLX transistor 350. Note that the CLK signal is at ground. Thus, in one possible approach, a discharge time period of the sense node begins when the XX0 transistor 356 is made conductive, and ends when the XX0 transistor is made non-conductive.

At a predetermined sensing time after discharging starts, the sense node is sensed to determine its voltage. At FLG, data is latched from the sense node based on the sense node level. In one possible approach, the NSEN transistor 360 performs this task. If the sense node voltage is above the threshold voltage of the NSEN transistor 360, the NSEN transistor 360 will be in a conductive state. This means the discharge of the sense node was not appreciable, and it can be concluded that the selected storage element is in a non-conductive state. On the other hand, if the sense node voltage is at or below the threshold voltage of the NSEN transistor 360, the NSEN transistor 360 will be in a non-conductive state. This means the discharge of the sense node was appreciable, and it can be concluded that the selected storage element is in a conductive state. The NSEN transistor 360 may therefore be considered to be a voltage-sensing transistor. FLG is set to 0 or 1 and output via the bus to the processor 192 according to whether the NSEN transistor 360 is in a conductive or non-conductive state, respectively, indicating that the selected storage element is in a non-conductive or conductive state, respectively. For example, the FLG node 328 is reset to high, and the STR transistor 358 and the FCO transistor 326 can be made conductive to attempt to flip the FLG latch 302. The FLG latch can be flipped from 1 to 0 if NSEN 360 is conductive, or not flipped if NSEN is not conductive.

In a reduced programming time technique, at a start of a programming operation, each storage element in a set is in the erased state. FLG is initialized or pre-set to 0 at a start of the programming operation for each storage element which is to remain in the erased state, and to 1 for each storage element which is to be programmed from the erased state to a programmed state. During programming, FLG will remain at 0 for the storage elements which are to remain in the erased state. FLG will flip from 1 to 0 for each storage element which reaches the programmed state. When FLG=0 for all, or nearly all (assuming a specified number of failed storage elements which can be corrected by ECC are allowed) of the storage elements to be programmed, the managing circuit can conclude that programming has been successfully completed. In this technique, it is not necessary to transfer the sensing results to the managing circuit and its data latches after each program-verify operation, perform logical operations at the managing circuit which compares the sensing results to the write data in the data latches, and transfer data back from the managing circuit to the sense module (to refresh FLG) to indicate whether the storage element should be programmed or inhibited in the next program-verify iteration. By avoiding these data transfers and logical operations, programming time is reduced. The managing circuit can perform a bit scan in each program-verify iteration by checking FLG (or INV) instead of its data latches. This bit scan can be performed while program and/or verify pulses are applied to the storage elements so that no additional time is needed. Further details of a reduced programming time technique are provided below in connection with FIGS. 7, 9a-c and 10.

Moreover, the no lockout mode can be enabled so that the bit line pre-charge path (via node 348, BLX, BLC and BLS) and the sense node pre-charge path (via HLL) are independent of the FLG node data.

The circuit of FIG. 3 is one possible implementation of a sense module. Other implementations are possible.

FIG. 4 depicts blocks of NAND flash memory cells in the memory array 155 of FIG. 1. The memory array can include many blocks. Each example block 400, 410 includes a number of NAND strings and respective bit lines, e.g., BL0, BL1, . . . which are shared among the blocks. Each NAND string is connected at one end to a drain select gate (SGD), and the control gates of the drain select gates are connected via a common SGD line. The NAND strings are connected at their other end to a source select gate which, in turn, is connected to a common source line 420. Sixty-four word lines, for example, WL0-WL63, extend between the source select gates and the drain select gates.

Other types of non-volatile memory in addition to NAND flash memory can also be used. For example, another type of memory cell useful in flash EEPROM systems utilizes a non-conductive dielectric material in place of a conductive floating gate to store charge in a non-volatile manner. A triple layer dielectric formed of silicon oxide, silicon nitride and silicon oxide ("ONO") is sandwiched between a conductive control gate and a surface of a semi-conductive substrate above the memory cell channel. The cell is programmed by injecting electrons from the cell channel into the nitride, where they are trapped and stored in a limited region. This stored charge then changes the threshold voltage of a portion of the channel of the cell in a manner that is detectable. The cell is erased by injecting hot holes into the nitride. A similar cell can be provided in a split-gate configuration where a doped polysilicon gate extends over a portion of the memory cell channel to form a separate select transistor.

In another approach, NROM cells are used. Two bits, for example, are stored in each NROM cell, where an ONO dielectric layer extends across the channel between source and drain diffusions. The charge for one data bit is localized in the dielectric layer adjacent to the drain, and the charge for the other data bit localized in the dielectric layer adjacent to the source. Multi-state data storage is obtained by separately reading binary states of the spatially separated charge storage regions within the dielectric. Other types of non-volatile memory are also known.

Figure 5A:
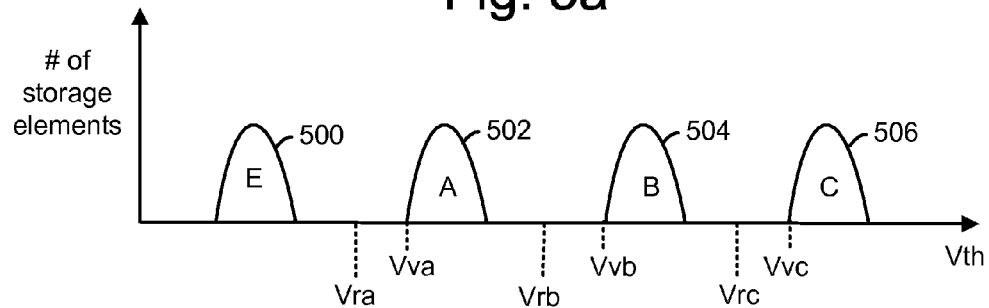
FIG. 5a depicts an example set of threshold voltage distributions in a four-level memory device.

FIG. 5a depicts an example set of threshold voltage distributions in a four-level memory device, also referred to as a multi-level device since multiple bits are stored in each storage element. Each storage element stores N=2 bits of data, and there are $2^N=4$ data states. A first threshold voltage distribution 500 is provided for erased (E state) storage elements, while threshold voltage distributions 502, 504 and 506 represent programmed states A, B and C, respectively. In one embodiment, the threshold voltages in the E distribution are negative and the threshold voltages in the A, B and C distributions are positive.

Each distinct threshold voltage range corresponds to predetermined values for the set of data bits. The specific relationship between the data programmed into the storage element and the threshold voltage levels of the storage element depends upon the data encoding scheme adopted for the storage elements. Although four states are shown, the other multi-state structures including those that include more or less than four states can also be used.

Three read reference voltages, Vra, Vrb and Vrc, are also provided for reading data from storage elements. By testing whether the threshold voltage of a given storage element is above or below Vra, Vrb and Vrc, the system can determine the state, e.g., programming condition, the storage element is in.

Further, three verify reference voltages, Vva, Vvb and Vvc, are provided. When programming storage elements to state A, B or C, the system will test whether those storage elements have a threshold voltage greater than or equal to Vva, Vvb or Vvc, respectively. Various program schemes are known, includes single pass and multiple-pass schemes. As mentioned, four, eight, sixteen or even more data states can be provided. Generally, $2^N-1$ sense levels are used when there are $2^N$ states.

Figure 5B:
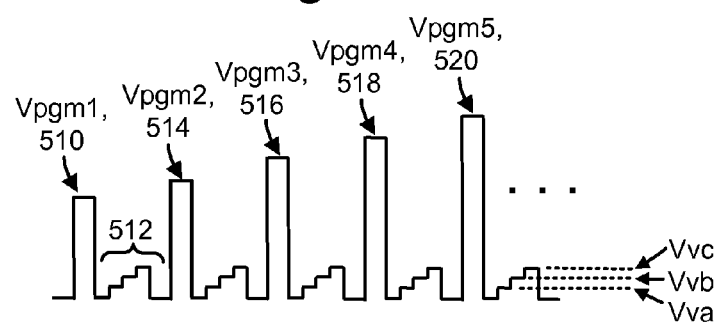
FIG. 5b depicts a voltage waveform applied to the control gates of storage elements during a program-verify iteration in a four-level memory device.

FIG. 5b depicts a voltage waveform applied to the control gates of storage elements during a program operation in a four-level memory device. The waveform or pulse train includes program pulses 510, 514, 516, 518 and 520 . . . , and a set of verify pulses between each program pulse, including example verify pulses 512, such as Vva, Vvb and Vvc. The program pulses can be fixed in amplitude, or they can step up by a fixed or varying step size, for instance. When each verify pulse is applied, a sense operation is performed for selected storage elements which are to be programmed to a particular target data state which is associated with the verify pulse, to evaluate the storage element's Vth relative to the verify voltage.

In one embodiment, the programming pulses have a voltage which starts at an initial level such as 12 V and increases by increments, e.g., 0.5 V, for each successive programming pulse until a maximum of, e.g., 20-25 V is reached. In some embodiments, there can be a verify pulse for each state that data is being programmed into, e.g., state A, B and C. In other embodiments, there can be more or fewer verify pulses. For example, verify pulses may be provided only for state A initially, then for states A and B, and then for states B and C. The waveform may be used during all bit line programming, for instance, in which storage elements of even- and odd-numbered bit lines are programmed together, and verified together. Or, the verify operation can be performed separately, e.g., first for the even-numbered bit lines and then for the odd-numbered bit lines.

Figure 5C:
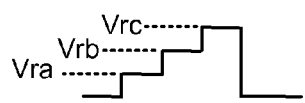
FIG. 5c depicts a voltage waveform applied to the control gates of storage elements during a read operation in a four-level memory device.

FIG. 5c depicts a voltage waveform applied to the control gates of storage elements during a read operation in a four-level memory device. For example, voltages such as Vra, Vrb and Vrc can be applied. Sensing operations include both verify and read operations.

Figure 6A:
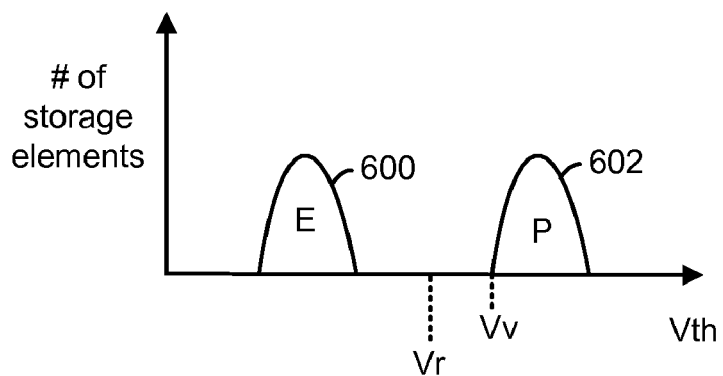
FIG. 6a depicts an example set of threshold voltage distributions in a binary memory device.

FIG. 6a depicts an example set of threshold voltage distributions in a two-level or binary memory device, also referred to as a single-level device since one bit is stored in each storage element. A first threshold voltage distribution 600 is provided for erased (E state) storage elements, while threshold voltage distribution 602 represents a programmed state (P state), respectively. A read reference voltage, Vr, is depicted. By testing whether the threshold voltage of a given storage element is above or below Vr, the system can determine the state, e.g., programming condition, the storage element is in. Further, a verify reference voltage, Vv, is depicted.

Figure 6B:
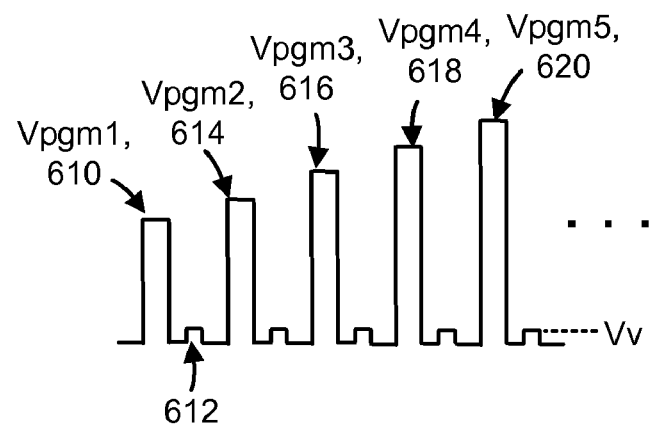
FIG. 6b depicts a voltage waveform applied to the control gates of storage elements during a program-verify iteration in a binary memory device.

FIG. 6b depicts a voltage waveform applied to the control gates of storage elements during a program operation in a binary memory device. The waveform or pulse train includes program pulses 610, 614, 616, 618 and 620 . . . , and a verify pulse between each program pulse, including example verify pulse 612, such as Vv.

Figure 6C:
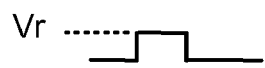
FIG. 6c depicts a voltage waveform applied to the control gates of storage elements during a read operation in a binary memory device.

FIG. 6c depicts a voltage waveform applied to the control gates of storage elements during a read operation in a binary memory device. For example, Vr can be applied.

Figure 7:
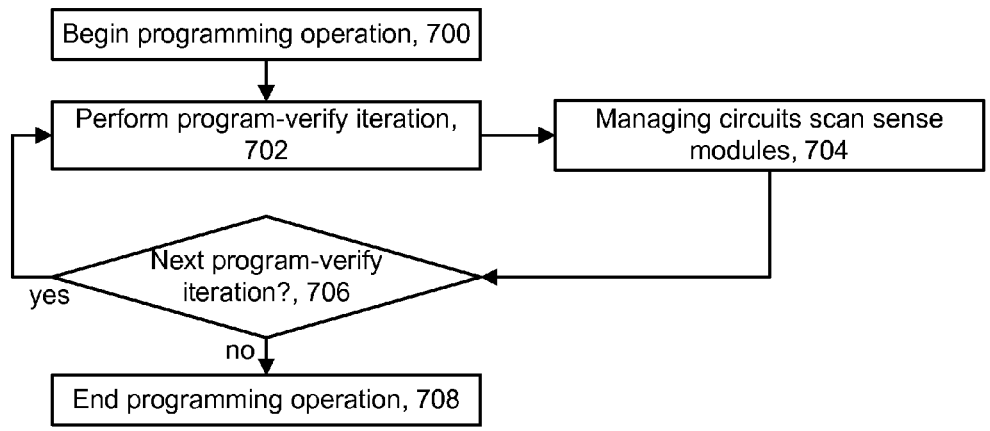
FIG. 7 depicts a programming operation.

FIG. 7 depicts a programming operation. A programming operation begins at step 700. A program-verify iteration is performed at step 702. At the same time, or before or after the program-verify iteration, one or more managing circuits of the sense modules can scan the sense modules (step 704) to ascertain the value of FLG, as discussed previously in connection with FIG. 3. At decision step 706, if the scan at step 704 indicates that a sufficient number of storage element have completed programming, then no further program-verify iteration is performed, and the programming operation ends at step 708. If decision step 706 is true, a next program-verify iteration is performed at step 702. Further details of the programming operation are discussed in connection with a reduced power consumption technique in FIGS. 8a-8e and 10, and in connection with a faster binary programming technique in FIGS. 9a-c and 10.

Figure 8A:
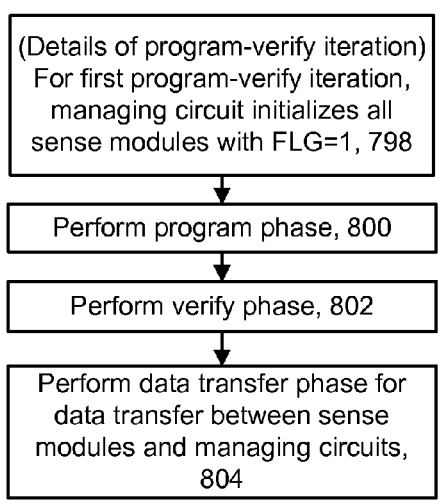
FIG. 8a depicts an example implementation of the program-verify iteration of step 702 of the programming operation of FIG. 7, which reduces power consumption.

FIG. 8a depicts an example implementation of the program-verify iteration of step 702 of the programming operation of FIG. 7, which results in reduced power consumption. At step 798, for a first program-verify iteration, the managing circuit initializes all sense modules with FLG=1. A programming phase is performed at step 800 (for further details see FIG. 8b), a verify phase is performed at step 802 (for further details see FIG. 8c) and a data transfer phase is performed at step 804 (for further details see FIG. 8e) to transfer data between the sense modules and one or more managing circuits.

Figure 8B:
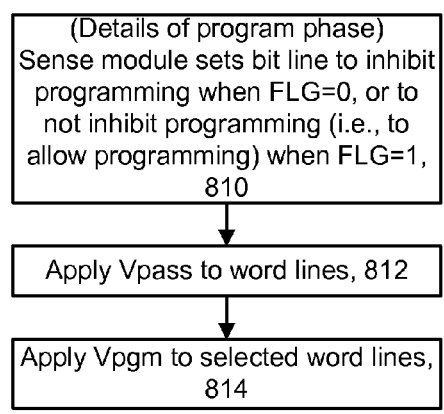

FIG. 8b depicts an example implementation of the program phase of step 800 of FIG. 8a. At step 810, the sense module sets the bit line to inhibit programming (e.g., Vbl=1 V) when FLG=0, or to not inhibit programming (e.g., Vbl=0 V) when FLG=1. At step 812, the power control 116 of the memory chip causes a pass voltage, Vpass, to be applied to each of the word lines. At step 814, Vpgm is applied to the selected word line.

FIG. 8c depicts an example implementation of the verify phase of step 802 of FIG. 8a. At step 820, the bit lines are pre-charged to a pre-charge level, e.g., 1.5-3 V, by clamping the bit line using the BLC transistor as discussed in connection with FIG. 3. If Vth=1 V for the BLC, transistor, Vblc=2.5-4 V. At step 822, the sense nodes of the sense modules for which FLG=1 are pre-charged as discussed in connection with FIG. 3. Steps 820 and 822 can be concurrent, at least in part. At step 824, a read pass voltage, Vread-pass, is applied to the unselected word lines, and one or more read voltages such as Vra, Vrb and Vrc are applied to the selected word line. At the same time, at step 826, the sense node is allowed to discharge into the bit line. At step 828, at the end of the discharge period, the sense node is allowed to communicate with the data node (e.g., the FLG node), depending on the level of the sense node. FLG is flipped from 1 to 0 if the sense node has discharged significantly and is low. Otherwise, FLG remains at 1 if the sense node has not discharged significantly and is high.

FIG. 8d depicts an example of the sense node discharge process of step 826 of FIG. 8c. Different lines of fixed current are depicted during a current sensing operation. In one possible approach, a sense module performs current sensing by determining a voltage drop at the sense node which is tied to a fixed current flow to the bit line by the relationship $\Delta V = i \cdot t/C$, where $\Delta V$ is the voltage drop at the sense node (and the bit line), i is the fixed current, t is a discharge time period, which is adaptively set as described, and C is the capacitance of the pre-charged capacitor 384 (FIG. 3). A greater voltage drop represents a higher current. For example, $\Delta V1 = i1 \cdot t/C$, $\Delta V2 = i2 \cdot t/C$, $\Delta V3 = i3 \cdot t/C$, and $\Delta V4 = i4 \cdot t/C$, where $\Delta V1 < \Delta V2 < \Delta V3 < \Delta V4$ and $i1 < i2 < i3 < i4$. At the end of the discharge period, since i and C are fixed, $\Delta V$ for a given current can be determined. In one approach, the NSEN transistor 360 is used to determine a level of $\Delta V$ relative to a demarcation value or trip point, which is the threshold voltage of the transistor 360.

Voltage sensing, in contrast, does not involve sensing a voltage drop which is tied to a fixed current. Instead, voltage sensing involves determining whether charge sharing occurs between a capacitor in a sensing circuit and a capacitance of the bit line. Current is not constant during the sensing. Little or no charge sharing occurs when the selected storage element is conductive, in which case the voltage of the capacitor in the voltage sensing module does not drop significantly. Charge sharing does occur when the selected storage element is non-conductive, in which case the voltage of the capacitor in the voltage sensing module does drop significantly.

The sensing module thus can determine whether the selected storage element is in a conductive or non-conductive state by the level of current. Generally, a higher current will flow (corresponding to a greater voltage discharge of the sense node) when the selected storage element is in a conductive state and a lower current, or essentially no current, will flow (corresponding to a lesser voltage discharge of the sense node) when the selected storage element is in a non-conductive state. It can be concluded that a threshold voltage of the selected storage element is above or below a compare level, such as a verify level or a read level, when it is in a non-conductive state or a conductive state, respectively.

Figure 8E:
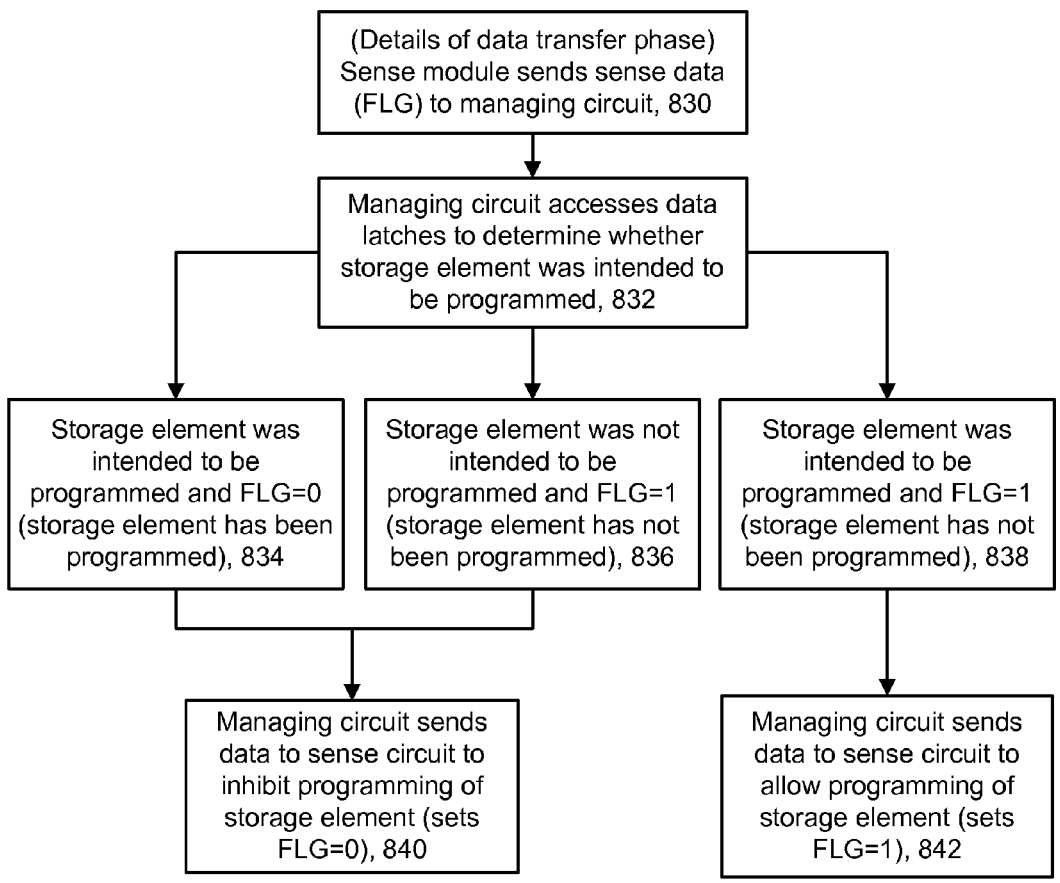

FIG. 8e depicts an example implementation of the data transfer phase of step 804 of FIG. 8a. At step 830, each sense module sends sense data (e.g., FLG) to its associated managing circuit. At step 832, the managing circuit accesses its data latches to determine whether the respective storage element of the sense module was intended to be programmed above the erased state. Typically, the data latches are initialized with the write data which identifies the intended data state of a storage element, and are updated as programming proceeds to indicate when a storage element has reached the intended data state and an inhibit condition. The processor in the managing circuit can perform logical operations involving the data latches and read results (e.g., FLG) from the sense module to determine when the storage element has reached the inhibit condition or other programming milepost. In some cases, a fast programming mode (using Vbl=0 V) can be used until the Vth of a storage element reaches an offset verify level which is below a target verify level of a target data state, after which a slow programming mode (using a raised Vbl) is used until the Vth of the storage element reaches the target verify level, after which programming is inhibited. In this case, the data latches can also keep track of whether the storage element is in the fast or slow programming mode. Different combinations of bit values in the data latches can indicate different programming conditions.

At step 832, three options are possible. In a first option, at step 834, the storage element was intended to be programmed, and FLG=0, which indicates that the storage element has been programmed. As a result, at step 840, the managing circuit sends data to the sense module to inhibit programming of the respective storage element in the next program-verify iteration. In a second option, at step 836, the storage element was not intended to be programmed, and FLG=1, which indicates that the storage element has not been programmed, as is expected. As a result, step 840 follows so that the sense module continues to inhibit programming of the respective storage element in the next program-verify iteration. In a third option, at step 838, the storage element was intended to be programmed, and FLG=1, which indicates that the storage element has not yet been programmed. At step 842, the managing circuit sends data to the sense module to allow programming of the respective storage element in the next program-verify iteration.

Figure 9A:
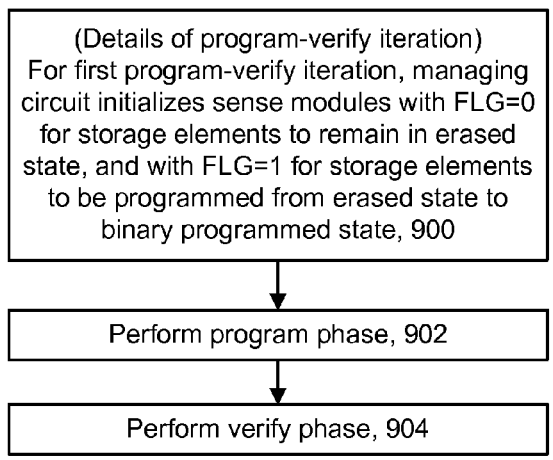
FIG. 9a depicts an example implementation of the program-verify iteration of step 702 of the programming operation of FIG. 7, which reduces programming time.

FIG. 9a depicts an example implementation of the program-verify iteration of step 702 of the programming operation of FIG. 7, which reduces programming time, as an alternative to FIG. 8. Step 900 relates to the start of a programming operation. For a first program-verify iteration, the one or more managing circuits initialize the sense modules with FLG=0 for the storage elements which are to remain in the erased stated, according to write data, and with FLG=1 for the storage elements which are to be programmed from the erased stated (E) to a binary programmed state (P), according to the write data. The program phase is performed at step 902 (as discussed in connection with FIG. 8b), and the verify phase is performed at step 904 (as discussed in connection with FIG. 8c).

FIGS. 10A-10O depict FIG. 10a depicts time lines associated with the reduced power consumption technique of FIGS. 8a-8e and the reduced programming time technique of FIG. 9a. The time line depicts, for one program-verify iteration, a portion of a "verify" phase (t0-t14), a first data transfer phase, ("xfer1") (t14-t19), and a second data transfer phase ("xfer2") (t19-t20). Also depicted for a next program-verify operation is a portion of a programming phase ("program") (t20-t25). The waveforms depict voltages of various transistors in the sense module of FIG. 3, as well as the bit line voltage. The voltages and the associated waveforms are: BL (1000 for an unselected bit line which is inhibited from programming, and 1002 for an unselected bit line, which is not inhibited from programming) (FIG. 10A), BLS (1004 for an unselected bit line, 1006 for a selected bit line) (FIG. 10B), BLC (1008) (FIG. 10C), BLY (1012 for an unselected bit line, 1010 for a selected bit line) (FIG. 10D), XX0 (1014) (FIG. 10E), HLL (1016) (FIG. 10F), H00 (1020 for an unselected bit line, 1018 for a selected bit line) (FIG. 10G), CLK (1022) (FIG. 10H), FLA (1024) (FIG. 10I), ICO (1028 for an unselected bit line, 1026 for a selected bit line) (FIG. 10J), RSB[3:0] (1030) (FIG. 10K), FRB (1032) (FIG. 10L), FCO (1034) (FIG. 10M), STR[3:0] (1036) (FIG. 10N) and STF (1038) (FIG. 10O).

Example voltages for BL (1000) are: Vss=0 V (t0-t6), Vbl (t6-t14), float (t14-t20), Vinhibit (t20-t25). Example voltages for BL (1002) are: Vss=0 V (t0-t6), Vbl (t6-t14), float (t14-t18), Vss (t18-t19), float (t19-t20) and Vss (t20-t25). Example voltages for BLS (1004) are: Vss (t0-t1), Vdd (t1-t4), and Vreadh, which provides BLS as a pass gate (t4-t25). Example voltages for BLS (1006) are: Vss (t0-t1), Vdd (t1-t4), Vreadh (t4-t19), Vss (t19-t20), Vdd (t20-21), and Vreadh (t21-t25). Example voltages for BLC (1008) are: Vss (t0-t4), Vsrc (source line voltage+Vth (t4-t6), Vsrc+Vth+Vbl (t6-t19), Vss (t19-20), and Vdd+Vth (t20-t25). Vth is the threshold voltage of the transistor at issue. Example voltages for BLY (1012) are: Vss (t0-t4), Vdd+Vth (t4-t6), Vblc+deltaV (t6-t7), Vdd+Vth (t7-t12), Vss (t12-t20), and Vdd+Vth (t20-t25). Example voltages for BLY (1010) are: Vss (t0-t4), Vdd+Vth (t4-t6), Vblc+deltaV (t6-t7), Vdd+Vth (t7-t12), Vss (t12-t18), Vdd (t18-t19), Vss (t19-t20), and Vdd+Vth (t20-t25). Example voltages for XX0 (1014) are: Vth (t0-t7), Vsrc+Vth (t7-t10), Vblc+deltaV (t10-t11), and Vth (t11-t25). Example voltages for HLL (1016) are: Vdd+Vth (t0-t1), and Vss (t1-t10). Example voltages for H00 (1020) are: Vss (t0-t4), Vhll (t4-t5), Vss (t5-t8), Vhll (t8-t9), and Vss (t9-t25). Example voltages for H00 (1018) are: Vss (t0-t4), Vhll (t4-t5), Vss (t5-t8), Vhll (t8-t9), Vss (t9-t18), Vdd (t18-t19) and Vss (t19-t25).

Example voltages for CLK (1022) are: Vsource ground (t0-t9+), Vblx (~t9-~t11), and Vsource ground (~t11-t25). Example voltages for FLA (1024) are: Vdd (Vdd for sense module or amplifier) (t0-t8), Vss (t8-t11), Vdd (t11-t20) and Vss (t20-t25). Example voltages for ICO (1028) are: Vss (t0-t15), Vdd/Vss data transfer (t15-t16), Vss (t16-t20) and Vdd (t20-t25). Example voltages for ICO (1026) are: Vss (t0-t15), Vdd/Vss data transfer (t15-t16), Vdd (t16-t19), Vss (t19-t20) and Vdd (t20-t25). Example voltages for RSB[3:0] (1030) are: Vdd (t0-t12), Vdd/Vss data transfer (t12-t13), Vdd (t13-t17), Vdd/Vss data transfer (t17-t18), and Vdd (t18-t25). Example voltages for FRB (1032) are: Vdd (t0-t12), Vss (t12-t13), Vdd (t13-t17), Vss (t17-t18), and Vdd (t18-t25). Example voltages for FCO (1032) are: Vdd (t0-t5), Vss (t5-t13), Vdd (t13-t14), and Vss (t14-t25). Example voltages for STR [3:0] (1036) are: Vss (t0-t3), Vdd/Vss data transfer (t3-t4), Vss (t4-t13), Vdd/Vss data transfer (t13-t14), and Vss (t14-t25). Example voltages for STF (1038) are: Vss (t0-t2), Vdd (t2-t4), Vss (t4-t12), Vdd (t12-t14), and Vss (t14-t25). BLX, UBS, LCO, STL, LRS and PRS=Vss from t0-t25.

In the verify phase, the bit line is pre-charged when it is clamped by BLC, so that a pre-charge level of Vbl is set from t6-t14. HLL and H00 are set high to allow the sense node to be pre-charged. The raising of the XX0 transistor (1014) from t10-t11, a discharge period, allows the sense node to discharge into the respective bit line, NAND string and the source line. From t13-t14, STR (1036) is toggled and FCO (1034) is high. If the sense node voltage is above a trip point, which can be the Vth of the NSEN transistor, then toggling STR will discharge FLG through the FCO transistor 326, STR 358 and NSEN 360 to the CLK node 388 at ground, so that FLG is flipped from 1 to 0. On the other hand, if the sense node voltage is below the trip point, there is no discharge current from the FLG path, so it stays high (at 1). Generally, each sense node which is associated with a conductive chain of series-connected storage elements discharges past the trip point, and each sense node which is associated with a non-conductive chain of series-connected storage elements does not discharge past the trip point.

At the end of the verify phase (t14), the bit line is floated at or near the pre-charge level through the first and second data transfer phases, until the start of the program phase at t20 (for the unselected bit line, waveform 1000). At t20, the bit line is driven at a level which inhibits programming. In this example, the bit line is driven at a higher level than the pre-charge level and the floating level. For the selected bit line (waveform 1002), the bit line is floated during a portion of the first data transfer phase, then driven lower, e.g., to 0 V (ground). The bit line is then floated at or near ground in the second data transfer phase until the program phase is reached, at which point the bit line is driven at ground. By keeping the unselected bit line high in the data transfer phases, between the verify and program phases, power consumption is reduced when the bit line is raised again in the program phase. In the case of waveform 1002 between t18-t20, a larger voltage swing would be experienced if the bit line was grounded and then driven back to an inhibit level in the program phase, resulting in increased power consumption.

In one approach which is compatible with the reduced power consumption technique, in the first data transfer phase at t15-t16, the sense modules communicate FLG to the managing circuits and their data latches. From t19-t20, the managing circuits evaluate FLG in view of the data latches to determine whether the storage element is an erased state storage element, a storage element which has completed programming, or a storage element which has not yet completed programming. Based on this evaluation, the managing circuits send data back to the sense modules to refresh the FLG value, either with the same binary value it had in the prior program-verify iteration (0 or 1) or with a changed value (1 or 0, respectively), as explained in connection with FIG. 8e. The program phase proceeds based on this refreshed FLG value so that the bit line is either inhibited (waveform 1000) or not inhibited (waveform 1002).

In another approach, which is compatible with the faster programming time technique, the use of the data transfer phases can be eliminated or reduced. As discussed, e.g., in connection with FIG. 9a, FLG from the sense modules can be initiated so that it is not necessary for the managing circuits to evaluate FLG relative to the data latches, and to refresh FLG in each sense module, for each program-verify iteration. In this case, the data transfer phases can be eliminated, resulting in reduced programming time. As mentioned, the managing circuits can ascertain the value of FLG in each sense module through a bit scan which is performed concurrent with the program and/or verify phases.

In one embodiment, a method for programming a set of storage elements with binary data in a non-volatile storage system is provided. The method includes receiving write data at one or more managing circuits (e.g., processor of a sense block) for use in a programming operation in which multiple program-verify iterations are performed. The one or more managing circuits store the write data in data latches, and manage multiple sense modules, including first and second sets of sense modules. The method further includes, at a start of a programming operation, for each sense module in the first set of sense modules, communicating data from the one or more managing circuits to the sense module to set a data node in the sense module to a first binary value (0) in response to which the respective storage element is inhibited from programming, and for each sense module in the second set of sense modules, communicating data from the one or more managing circuits to the sense module to set a data node (FLG) in the sense module to a second binary value (1), opposite the first binary value, in response to which the respective storage element is not inhibited from programming. Moreover, for each sense module in the second set of sense modules, the one or more managing circuits obtain data, such as in a scan operation, from the sense module which indicates that its data node maintains the second binary value (1), until the respective storage element is verified to complete programming in a respective program-verify iteration of the plurality of program-verify iterations, in response to which the sense module flips its data node to the first binary value (0), and obtain data from the sense module which indicates that its data node has been flipped to the first binary value (0). Further, without referring to the data latches, the one or more managing circuits determine that the programming operation is completed in response to obtaining the data from each sense module in the second set of sense modules which indicates that its data node has been flipped to the first binary value (0).

In another embodiment, a related non-volatile storage system is provided. It includes first and second sets of storage elements, a first set of sense modules, where each sense module in the first set of sense modules is associated with a respective storage element in the first set of storage elements, a second set of sense modules, where each sense module in the second set of sense modules is associated with a respective storage element in the second set of storage elements, data latches, and one or more managing circuits which manage the first and second sets of sense modules. The one or more managing circuits store the write data in data latches, and: (a) at a start of the programming operation, for each sense module in the first set of sense modules, communicate data to the sense module to set a data node (FLG) in the sense module to a first binary value (0) in response to which the respective storage element is inhibited from programming, and for each sense module in the second set of sense modules, communicate data to the sense module to set a data node (FLG) in the sense module to a second binary value (1), opposite the first binary value, in response to which the respective storage element is not inhibited from programming, (b) for each sense module in the second set of sense modules, obtain data (in a scan operation) from the sense module which indicates that its data node maintains the second binary value (1), until the respective storage element is verified to complete programming in a respective program-verify iteration of the plurality of program-verify iterations, in response to which the sense module flips its data node to the first binary value (0), and obtain data from the sense module which indicates that its data node has been flipped to the first binary value (0), and (c) without referring to the data latches, determine that the programming operation is completed in response to obtaining the data from each sense module in the second set of sense modules which indicates that its data node has been flipped to the first binary value (0).

In another embodiment, a method for programming a set of storage elements in a non-volatile storage system is provided. The method includes performing multiple program-verify iterations of a programming operation for the set of storage elements, where each storage element is associated with a respective bit line, each bit line is associated with a respective sense module, the sense modules are managed by one or more managing circuits, and each program-verify iteration includes a program phase, followed by a verify phase, followed by at least one data transfer phase in which data is transferred between the sense modules and the one or more managing circuits. The method further includes, for one program-verify iteration of the multiple program-verify iterations, for an inhibited storage element in the set of storage elements: (a) in the program phase, setting a respective bit line of the inhibited storage element at a level which inhibits programming of the inhibited storage element, (b) in the verify phase, pre-charging the respective bit line of the inhibited storage element to a pre-charge level, (c) in the at least one data transfer phase, floating the respective bit line of the inhibited storage element, without driving the respective bit line of the inhibited storage element lower, and (d) in a program phase of a next program-verify iteration of the multiple program-verify iterations, drive the respective bit line of the inhibited storage element at a level which inhibits programming of the inhibited storage element.

In another embodiment, a related non-volatile storage system is provided. It includes a set of storage elements, a respective bit line associated with each storage element, a respective sense module associated with each respective bit line, and one or more managing circuits which manage the respective sense modules. The one or more managing circuits: (a) perform multiple program-verify iterations of a programming operation for the set of storage elements, each program-verify iteration includes a program phase, followed by a verify phase, followed by at least one data transfer phase in which data is transferred between the sense modules and the one or more managing circuits. Further, the one or more managing circuits, (b) for one program-verify iteration of the multiple program-verify iterations, for an inhibited storage element in the set of storage elements: (i) in the program phase, set a respective bit line of the inhibited storage element at a level which inhibits programming of the inhibited storage element, (ii) in the verify phase, pre-charge the respective bit line of the inhibited storage element to a pre-charge level, (iii) in the at least one data transfer phase, float the respective bit line of the inhibited storage element, without driving the respective bit line of the inhibited storage element lower, and (iv) in a program phase of a next program-verify iteration of the multiple program-verify iterations, drive the respective bit line of the inhibited storage element at a level which inhibits programming of the inhibited storage element.

Corresponding methods, systems and computer- or processor-readable storage devices for performing the methods provided herein are provided.

The foregoing detailed description has been presented for purposes of illustration and description. It is not intended to be exhaustive or limited to the precise form disclosed. Many modifications and variations are possible in light of the above teaching. The described embodiments were chosen in order to best explain the principles of the technology and its practical application, to thereby enable others skilled in the art to best utilize the technology in various embodiments and with various modifications as are suited to the particular use contemplated. It is intended that the scope of the technology be defined by the claims appended hereto.

We claim:

1. A method for programming a set of storage elements with binary data in a non-volatile storage system, the method comprising:
receiving write data at one or more managing circuits for use in a programming operation in which a plurality of program-verify iterations are performed, the one or more managing circuits store the write data in data latches, and manage a plurality of sense modules which includes first and second sets of sense modules;

at a start of the programming operation, for each sense module in the first set of sense modules, communicating data from the one or more managing circuits to the sense module to set a data node (FLG) in the sense module to a first binary value in response to which a respective storage element is inhibited from programming, and for each sense module in the second set of sense modules, communicating data from the one or more managing circuits to the sense module to set a data node (FLG) in the sense module to a second binary value, opposite the first binary value, in response to which a respective storage element is not inhibited from programming;

for each sense module in the second set of sense modules, the one or more managing circuits obtain data from the sense module which indicates that its data node maintains the second binary value, until the respective storage element is verified to complete programming in a respective program-verify iteration of the plurality of program-verify iterations, in response to which the sense module flips its data node to the first binary value, and the one or more managing circuits obtain data from the sense module which indicates that its data node has been flipped to the first binary value; and without referring to the data latches, the one or more managing circuits determine that the programming operation is completed in response to obtaining the data from each sense module in the second set of sense modules which indicates that its data node has been flipped to the first binary value.

2. The method of claim 1, wherein:
the one or more managing circuits determine that the programming operation is completed without performing logical operations involving the data latches and the data obtained from each sense module in the second set of sense modules which indicates that its data node has been flipped to the first binary value.

3. The method of claim 1, wherein:
in each of the plurality of program-verify iterations, for each sense module in the first set of sense modules, the one or more managing circuits obtain data from the sense module which indicates that its data node maintains the first binary value.

4. The method of claim 3, wherein:
the one or more managing circuits perform a scan operation for each of the sense modules in each program-verify operation to obtain the data from each sense module in the second set of sense modules which indicates that its data node maintains the second binary value or has been flipped to the first binary value, and to obtain the data from each sense module in the first set of sense modules which indicates that its data node maintains the first binary value.

5. The method of claim 1, wherein:
during the programming operation, after the start of the programming operation, the sense modules receive no further data which indicates whether the respective storage element is to be inhibited from programming or not inhibited from programming.

6. The method of claim 1, wherein:
during the programming operation, after the start of the programming operation, the data nodes of the sense modules are not refreshed.

7. A non-volatile storage system, comprising:
first and second sets of storage elements;
a first set of sense modules, each sense module in the first set of sense modules is associated with a respective storage element in the first set of storage elements;
a second set of sense modules, each sense module in the second set of sense modules is associated with a respective storage element in the second set of storage elements;
data latches; and
one or more managing circuits which store write data in the data latches and manage the first and second sets of sense modules, the one or more managing circuits: (a) at a start of a programming operation in which a plurality of program-verify iterations are performed, for each sense module in the first set of sense modules, communicate data to the sense module to set a data node (FLG) in the sense module to a first binary value in response to which the respective storage element is inhibited from programming, and for each sense module in the second set of sense modules, communicate data to the sense module to set a data node (FLG) in the sense module to a second binary value, opposite the first binary value, in response to which the respective storage element is not inhibited from programming, (b) for each sense module in the second set of sense modules, obtain data from the sense module which indicates that its data node maintains the second binary value, until the respective storage element is verified to complete programming in a respective program-verify iteration of the plurality of program-verify iterations, in response to which the sense module flips its data node to the first binary value, and obtain data from the sense module which indicates that its data node has been flipped to the first binary value, and (c) without referring to the data latches, determine that the programming operation is completed in response to obtaining the data from each sense module in the second set of sense modules which indicates that its data node has been flipped to the first binary value.

8. The non-volatile storage system of claim 7, wherein:
for each sense module, and in each program-verify iteration, a bit line pre-charge path and a sense node pre-charge path are independent of the data node.

9. The non-volatile storage system of claim 7, wherein:
the managing circuit, the sense modules and the first and second sets of storage elements are on a common chip, and the managing circuit communicates with the sense modules via a bus.

10. The non-volatile storage system of claim 9, wherein:
the first and second sets of storage elements are on a common word line in a memory array on the common chip, and each storage element is in a respective NAND string.

11. The non-volatile storage system of claim 7, wherein:
the one or more managing circuits determine that the programming operation is completed without performing logical operations involving the data latches and the data obtained from each sense module in the second set of sense modules which indicates that its data node has been flipped to the first binary value.

12. The non-volatile storage system of claim 7, wherein:
the one or more managing circuits perform a scan operation for each of the sense modules in each program-verify operation to obtain the data from each sense module in the second set of sense modules which indicates that its data node maintains the second binary value or has been flipped to the first binary value, and to obtain data from each sense module in the first set of sense modules which indicates that its data node maintains the first binary value.

13. The non-volatile storage system of claim 7, wherein:
during the programming operation, after the start of the programming operation, the sense modules receive no further data which indicates whether the respective storage element is to be inhibited from programming or not inhibited from programming.

14. A method for programming a set of storage elements in a non-volatile storage system, the method comprising:
performing a plurality of program-verify iterations of a programming operation for the set of storage elements, each storage element is associated with a respective bit line, each bit line is associated with a respective sense module, the sense modules are managed by one or more managing circuits, and each program-verify iteration includes a program phase, followed by a verify phase, followed by at least one data transfer phase in which data is transferred between the sense modules and the one or more managing circuits; and
for one program-verify iteration of the plurality of program-verify iterations, for an inhibited storage element in the set of storage elements: (a) in the program phase, setting a respective bit line of the inhibited storage element at a level which inhibits programming of the inhibited storage element, (b) in the verify phase, pre-charging the respective bit line of the inhibited storage element to a pre-charge level, (c) in the at least one data transfer phase, floating the respective bit line of the inhibited storage element, without driving the respective bit line of the inhibited storage element lower, and (d) in a program phase of a next program-verify iteration of the plurality of program-verify iterations, driving the respective bit line of the inhibited storage element at a level which inhibits programming of the inhibited storage element.

15. The method of claim 14, wherein:
for the one program-verify iteration, in the verify phase, the respective bit line of the inhibited storage element is pre-charged to the pre-charge level by clamping the respective bit line of the inhibited storage element using a bit line clamp (BLC) transistor, the respective bit line of the inhibited storage element is connected to the bit line clamp transistor via a bit line sense (BLS) transistor, and a level of a control gate voltage of the bit line sense transistor is maintained at a level which renders the bit line sense (BLS) transistor in a conductive state, from an end of the verify phase, through the at least one data transfer phase, up through at least a start of the program phase of the next program-verify iteration.

16. The method of claim 14, wherein:
the respective bit line of the inhibited storage element is floated at the pre-charge level from an end of the verify phase of the one program-verify iteration to a start of the program phase of the next program-verify iteration.

17. The method of claim 14, further comprising:
for the one program-verify iteration of the plurality of program-verify iterations, and for a selected storage element in the set of storage elements: (a) in the program phase, setting a respective bit line of the selected storage element at a level which allows programming of the selected storage element, (b) in the verify phase, pre-charging the respective bit line of the selected storage element to the pre-charge level, (c) in the at least one data transfer phase, driving the respective bit line of the selected storage element lower, and (d) in the program phase of the next program-verify iteration, setting the respective bit line of the selected storage element at a level which allows programming of the selected storage element.

18. A non-volatile storage system, comprising:
a set of storage elements;
a respective bit line associated with each storage element;
a respective sense module associated with each respective bit line; and
one or more managing circuits which manage the respective sense modules, the one or more managing circuits:
(a) perform a plurality of program-verify iterations of a programming operation for the set of storage elements, each program-verify iteration includes a program phase, followed by a verify phase, followed by at least one data transfer phase in which data is transferred between the sense modules and the one or more managing circuits, and (b) for one program-verify iteration of the plurality of program-verify iterations, for an inhibited storage element in the set of storage elements: (i) in the program phase, set a respective bit line of the inhibited storage element at a level which inhibits programming of the inhibited storage element, (ii) in the verify phase, pre-charge the respective bit line of the inhibited storage element to a pre-charge level, (iii) in the at least one data transfer phase, float the respective bit line of the inhibited storage element, without driving the respective bit line of the inhibited storage element lower, and (iv) in a program phase of a next program-verify iteration of the plurality of program-verify iterations, drive the respective bit line of the inhibited storage element at a level which inhibits programming of the inhibited storage element.

19. The non-volatile storage system of claim 18, wherein:
for the one program-verify iteration, in the program phase, the respective bit line of the inhibited storage element is set at the level which inhibits programming of the inhibited storage element by clamping the respective bit line of the inhibited storage element using a bit line clamp (BLC) transistor, the respective bit line of the inhibited storage element is connected to the bit line clamp transistor via a bit line sense (BLS) transistor, and a level of a control gate voltage of the bit line sense transistor is maintained at a level which renders the bit line sense (BLS) transistor in a conductive state, from an end of the program phase, through the at least one data transfer phase, up to at least a start of the program phase of the next program-verify iteration.

20. The non-volatile storage system of claim 18, wherein:
the respective bit line of the inhibited storage element is floated at the pre-charge level from an end of the verify phase of the one program-verify iteration to a start of the program phase of the next program-verify iteration.

* * * * *